US006661249B2

(12) United States Patent
Oyrer

(10) Patent No.: US 6,661,249 B2
(45) Date of Patent: Dec. 9, 2003

(54) CIRCUIT CONFIGURATION WITH A LOAD TRANSISTOR AND A CURRENT MEASURING CONFIGURATION

(75) Inventor: Robert Oyrer, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/060,985

(22) Filed: Jan. 30, 2002

(65) Prior Publication Data

US 2002/0101225 A1 Aug. 1, 2002

(30) Foreign Application Priority Data

Jan. 30, 2001 (DE) ........................................ 101 03 920

(51) Int. Cl.[7] .................................................. G01R 3/26
(52) U.S. Cl. ....................................................... 324/769
(58) Field of Search ................................ 324/522, 127, 324/537, 765, 771, 769; 361/160; 307/127

(56) References Cited

U.S. PATENT DOCUMENTS 4,967,309 A 10/1990 Hoffman ..................... 361/160
5,815,027 A * 9/1998 Tihanyi et al. .............. 327/543

FOREIGN PATENT DOCUMENTS

| | | | |
|---|---|---|---|
| DE | 40 05 813 | A1 | 8/1991 |
| DE | 195 20 735 | A1 | 12/1996 |
| DE | 198 12 920 | C2 | 12/1999 |
| DE | 198 38 657 | A1 | 3/2000 |
| FR | 2 642 176 | A1 | 7/1990 |

* cited by examiner

*Primary Examiner*—N. Le
*Assistant Examiner*—James Kerveros
(74) *Attorney, Agent, or Firm*—Laurence A. Greenberg; Werner H. Stemer; Ralph E. Locher

(57) ABSTRACT

A circuit configuration includes a load transistor having a control terminal, a first load path terminal connected to a first supply potential, and a second load path terminal connected a load. A load current flows between the first load path terminal and the second load path terminal. The circuit configuration further includes a current measuring configuration connected to the load transistor, the current measuring configuration having an output for providing a measuring current between the output of the current measuring configuration and a second supply potential. The current measuring configuration provides the measuring current such that the measuring current and the load current have opposite signs and such that the absolute value of the measuring current is proportional to the absolute value of the load current.

22 Claims, 5 Drawing Sheets

CIRCUIT CONFIGURATION WITH A LOAD TRANSISTOR AND A CURRENT MEASURING CONFIGURATION

BACKGROUND OF THE INVENTION

Field of the Invention

The invention relates to a circuit configuration with a load transistor for switching a load and with a current measuring configuration for sensing a load current through the load transistor.

FIG. 1 shows such a circuit configuration with a load transistor T10 which is embodied as a MOS (Metal Oxide Semiconductor) transistor, and a current measuring configuration 100 which is connected to the load transistor T10 and operates according to what is referred to as the "current-sense principle." The drain terminal of the load transistor T10 is connected to a first supply potential V10 and its source terminal S is connected via a load to a second supply potential GND. The load transistor T10 functions as a switch for driving the load, the transistor T10 in the example is conducting if a potential, which is higher than the potential at its source terminal S by a value of a threshold voltage, is applied to its gate terminal G. A load current I10 then flows through the transistor T10 and the load. In the current measuring configuration operating according to the current-sense principle there is a measuring transistor T20 which is operated at the same operating point as the load transistor T10. The drain terminal D of the measuring transistor T20 is connected for this purpose to the drain terminal D of the load transistor T10, and the gate terminal G of the measuring transistor T20 is connected to the gate terminal of the load transistor T10. In order to set the operating point of the measuring transistor T20 there is a control amplifier or operational amplifier OPV, one of whose inputs is connected to the source terminal S of the first transistor T10, and the other terminal of which is connected to the source terminal S of the second transistor T20. An output of the control amplifier OPV controls a transistor T30 which is connected downstream of the measuring transistor T20 in such a way that the potentials at the source terminals S of the load transistor T10 and of the measuring transistor T20 correspond. The load transistor T10 and the measuring transistor T10 are usually implemented in a common semiconductor element or chip through the use of the same manufacturing process, the transistor area of the load transistor T10 being considerably greater than that of the measuring transistor T20. The current I20 through the measuring transistor T20, which is operated at the same operating point as the load transistor T10, is proportional to the load current I10, the proportionality factor corresponding to the ratio of the transistor areas. A voltage U30, which is proportional to the load current I10, can then be tapped off with respect to the second supply potential GND at a resistor R30 which is connected downstream of the transistor T30 and one of whose terminals is connected to the transistor T30 and the other of whose terminals is connected to the second supply potential.

A disadvantage with the circuit configuration illustrated in FIG. 1 with a load transistor T10 and a current measuring configuration 100 is that the current measuring configuration 100 supplies a measuring current I20 which is proportional to the load current I10 only if the load transistor T10 is in the normal operating mode. An n-type channel transistor is in the normal operating mode if its drain potential is greater than its source potential, and a p-type channel transistor is in the normal operating mode if its drain potential is smaller than its source potential. The measuring configuration does not function in what is referred to as "inverse operation" of the load transistor T10 when the source potential in n-type channel transistors is greater than the drain potential, and the current I10 flows counter to the direction shown in FIG. 1. In order to bring about a corresponding measuring current through the measuring transistor T10 counter to the direction shown in FIG. 1, a potential which is greater than the first supply potential V10, in accordance with the potential at the source terminal of the load transistor T10, would have to be available at the source terminal S of the measuring transistor T20 given a sufficient current yield. The provision of such a potential given sufficient current yield to provide a measuring current in the source-drain direction of the measuring transistor T20 is not possible on-chip, that is to say in the same semiconductor element in which the load transistor T10 and the current measuring configuration 100 are implemented, or is only possible with considerable additional expenditure.

SUMMARY OF THE INVENTION

It is accordingly an object of the invention to provide a circuit configuration with a load transistor and a current measuring configuration which overcomes the above-mentioned disadvantages of the heretofore-known circuit configurations of this general type and which permits current to be measured during the inverse operation of the load transistor.

With the foregoing and other objects in view there is provided, in accordance with the invention, a circuit configuration, including:

a load transistor having a control terminal, a first load path terminal to be connected to a first supply potential, and a second load path terminal to be connected a load, the load transistor having a load current flowing between the first load path terminal and the second load path terminal; and a current measuring configuration connected to the load transistor, the current measuring configuration having an output for providing a measuring current between the output of the current measuring configuration and a second supply potential, the current measuring configuration providing the measuring current such that the measuring current and the load current have respectively opposite signs and such that the measuring current and the load current have respective absolute values at least substantially proportional to one another.

In other words, the circuit configuration according to the invention has a load transistor with a control terminal, a first load path terminal which is connected to a terminal for a first supply potential, and a second load path terminal for connecting to a load. A current measuring configuration is connected to the first transistor, the current measuring configuration has an output at which a measuring current to a second supply potential is available, the measuring current has a sign opposite to that of a load current between the first and second load path terminals of the load transistor and the absolute value of the measuring current is at least approximately proportional to the absolute value of the load current.

According to one embodiment of the invention, the current measuring configuration has a measuring transistor with a control terminal, a first load path terminal and a second load path terminal. The current measuring configuration also has a control circuit with a controllable resistor which is connected to the second load path terminal of the measuring transistor, and a drive circuit for driving the resistor, the drive circuit driving, according to one embodiment, the controllable resistor as a function of a first load path voltage between the first and second load path terminals of the load transistor, and as a function of a second load path voltage between the first and second load path terminals of the measuring transistor, in such a way that the absolute value of the second load path voltage corresponds to the absolute value of the first load path voltage, and the second load path voltage has a sign which is reversed in comparison with the first load path voltage.

According to a further embodiment of the circuit configuration according to the invention, there is provision for the drive circuit to set the absolute value of the second load path voltage to be smaller than the absolute value of the first load path voltage.

The drive circuit preferably adjusts the voltage between the control terminal and the second load path terminal of the measuring transistor in such a way that it corresponds to the voltage between the control terminal and the first load path terminal of the load transistor. The measuring transistor which is of the same conduction type as the load transistor is then operated at an "inverse operating point" with respect to the operating point of the load transistor.

If the load transistor and the measuring transistor are preferably MOS transistors in which the drain terminal corresponds to the first load path terminal, the source terminal corresponds to the second load path terminal and the gate terminal corresponds to the control terminal.

The load transistor is in the inverse operating mode which is distinguished in the case of n-type channel MOS transistors by a negative drain-source voltage, and in the case of p-type channel transistors by a positive drain-source voltage, the measuring transistor, which is of the same conduction type as the load transistor, is in the normal operating mode, which is distinguished in the case of n-type channel MOS transistors by a positive drain-source voltage and in the case of p-type channel transistors by a negative drain-source voltage.

According to one embodiment of the invention, a control circuit is connected between the control terminal of the load transistor and the control terminal of the measuring transistor in order to adjust the voltage between the control terminal and the second load path terminal of the measuring transistor, the control circuit being additionally connected to the first load path terminal of the load transistor and to the second load path terminal of the measuring transistor. The conduction behavior of the load transistor is determined in the inverse operating mode by the voltage between its control terminal and its first load path terminal, that is to say the gate-drain voltage in the case of MOS transistors, while the conduction behavior of the measuring transistor is determined by the voltage between its control terminal and its second load path terminal, that is to say the gate-source voltage in the case of MOS transistors. The control circuit is embodied in such a way that the voltage between the control terminal and the first load path terminal of the first transistor corresponds to the voltage between the control terminal and the second load path terminal of the measuring transistor. The load transistor and the measuring transistor are thus operated at operating points which are "inverted" with respect to one another and which are distinguished by an opposed current flow in the transistors. If a negative drain-source current flows through the load transistor when an n-type channel MOS transistor is used in the inverse operating mode, the drain-source current of the measuring transistor is positive.

In the circuit configuration according to the invention, in the inverse operating mode of the load transistor a measuring current which is positive with respect to the second supply potential and whose absolute value is proportional to the load current is available if, in the case of an n-type channel transistor, a potential which is greater than its drain potential is applied to the source terminal of the n-type channel transistor by a connected load.

According to another feature of the invention, the current measuring configuration has a first connecting terminal connected to the first load path terminal of the load transistor, a second connecting terminal connected to the second load path terminal of the load transistor, and a third connecting terminal connected to the control terminal of the load transistor.

According to yet another feature of the invention, the current measuring configuration includes a measuring transistor having a control terminal, a first load path terminal and a second load path terminal; a controllable resistor having a control terminal and a load path, the load path being connected to the second load path terminal of the measuring transistor; and a drive circuit having an output terminal connected to the control terminal of the controllable resistor, the drive circuit being connected to the control terminal of the load transistor, to the first load path terminal of the load transistor, to the second load path terminal of the load transistor, to the control terminal of the measuring transistor, to the first load path terminal of the measuring transistor and to the second load path terminal of the measuring transistor.

According to a further feature of the invention, the drive circuit drives the controllable resistor in dependence of a first load path voltage between the first and second load path terminals of the load transistor, and in dependence of a second load path voltage between the first and second load path terminals of the measuring transistor.

According to another feature of the invention, the drive circuit drives the controllable resistor such that the second load path voltage and the first load path voltage have substantially identical absolute values and such that the second load path voltage and the first load path voltage have respectively opposite signs.

According to yet another feature of the invention, the drive circuit drives the controllable resistor such that an absolute value of the second load path voltage is smaller than an absolute value of the first load path voltage, and such that the second load path voltage and the first load path voltage have respectively opposite signs.

According to a further feature of the invention, the drive circuit includes a series circuit including a first resistor, a second resistor and a tap node; and the drive circuit further includes a control amplifier having a first input, a second input, and an output, the tap node of the series circuit being connected to the first input of the control amplifier, the first load path terminals of the load transistor and of the measuring transistor being connected to the second input of the control amplifier, and the control terminal of the controllable resistor being connected to the output of the control amplifier.

According to another feature of the invention, the controllable resistor is a transistor.

According to yet another feature of the invention, the first resistor and the second resistors have substantially identical resistance values.

According to another feature of the invention, the first resistor has a first resistance, the second resistor has a second resistance, and the first resistance is greater than the second resistance.

According to yet another feature of the invention, the control terminal of the load transistor is connected to the control terminal of the measuring transistor.

According to a further feature of the invention, a control configuration is connected between the control terminal of the load transistor and the control terminal of the measuring transistor.

According to yet a further feature of the invention, the control configuration sets a first voltage between the control terminal of the measuring transistor and the second load path terminal of the measuring transistor such that the first voltage has an absolute value substantially identical to an absolute value of a second voltage present between the control terminal of the load transistor and the first load path terminal of the load transistor.

According to another feature of the invention, the control configuration sets a first voltage between the control terminal of the measuring transistor and the second load path terminal of the measuring transistor such that an absolute value of the first voltage is smaller than an absolute value of a second voltage present between the control terminal of the load transistor and the first load path terminal of the load transistor.

According to yet another feature of the invention, the control configuration includes a third resistor connected between the control terminal of the load transistor and the control terminal of the measuring transistor; a series circuit including a fourth resistor and a controllable resistor, the series circuit being connected between the control terminal of the measuring transistor and the second load path terminal of the measuring transistor, the fourth resistor and the controllable resistor having a common node; and a control amplifier having a first input connected to the first load path terminal of the load transistor and to the first load path terminal of the measuring transistor, a second input connected to the common node, and an output connected to the control terminal of the controllable resistor.

According to a further feature of the invention, the third resistor and the fourth resistor have substantially identical resistance values.

According to another feature of the invention, the third resistor has a third resistance, the fourth resistor has a fourth resistance, and the fourth resistance is smaller than the third resistance.

According to yet another feature of the invention, the controllable resistor is a transistor.

Other features which are considered as characteristic for the invention are set forth in the appended claims.

Although the invention is illustrated and described herein as embodied in a circuit configuration with a load transistor and a current measuring configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Referring now to the figures of the drawings in detail in which, unless stated otherwise, identical reference symbols designate identical parts. The invention is described below with reference to a circuit configuration with an n-type channel MOS transistor as load transistor whose gate terminal forms a control terminal, whose drain terminal forms a first load path terminal and whose source terminal forms a second load path terminal. The circuit configuration according to the invention of course also functions with a p-type channel MOS transistor as load transistor, in which case the signs of the potentials and voltages mentioned below for the sake of explanation are to be interchanged.

Figure 1:
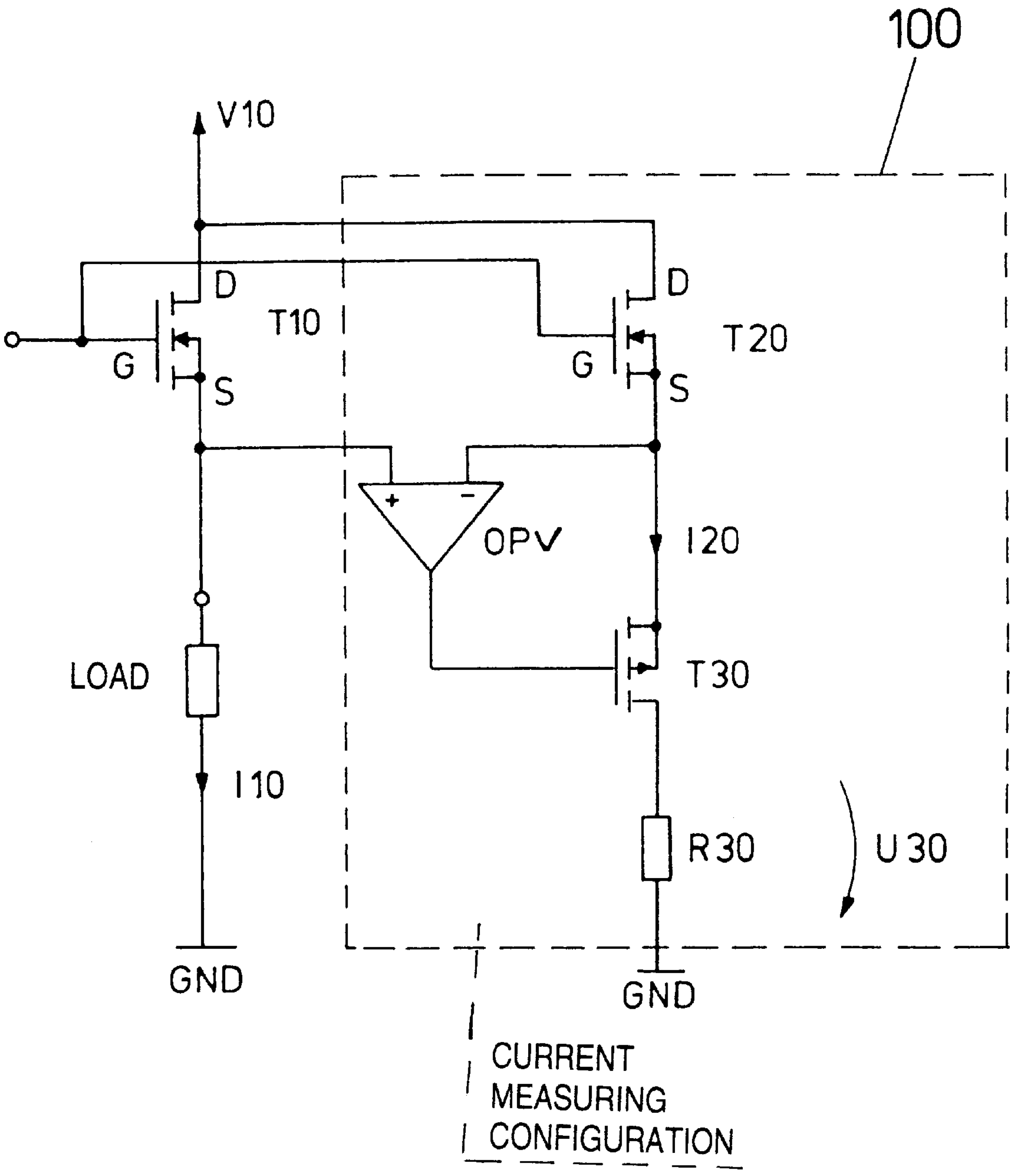
FIG 1 PRIOR ART
FIG. 1 is a circuit diagram of a conventional circuit configuration having a load transistor and a current measuring configuration.
Figure 2:
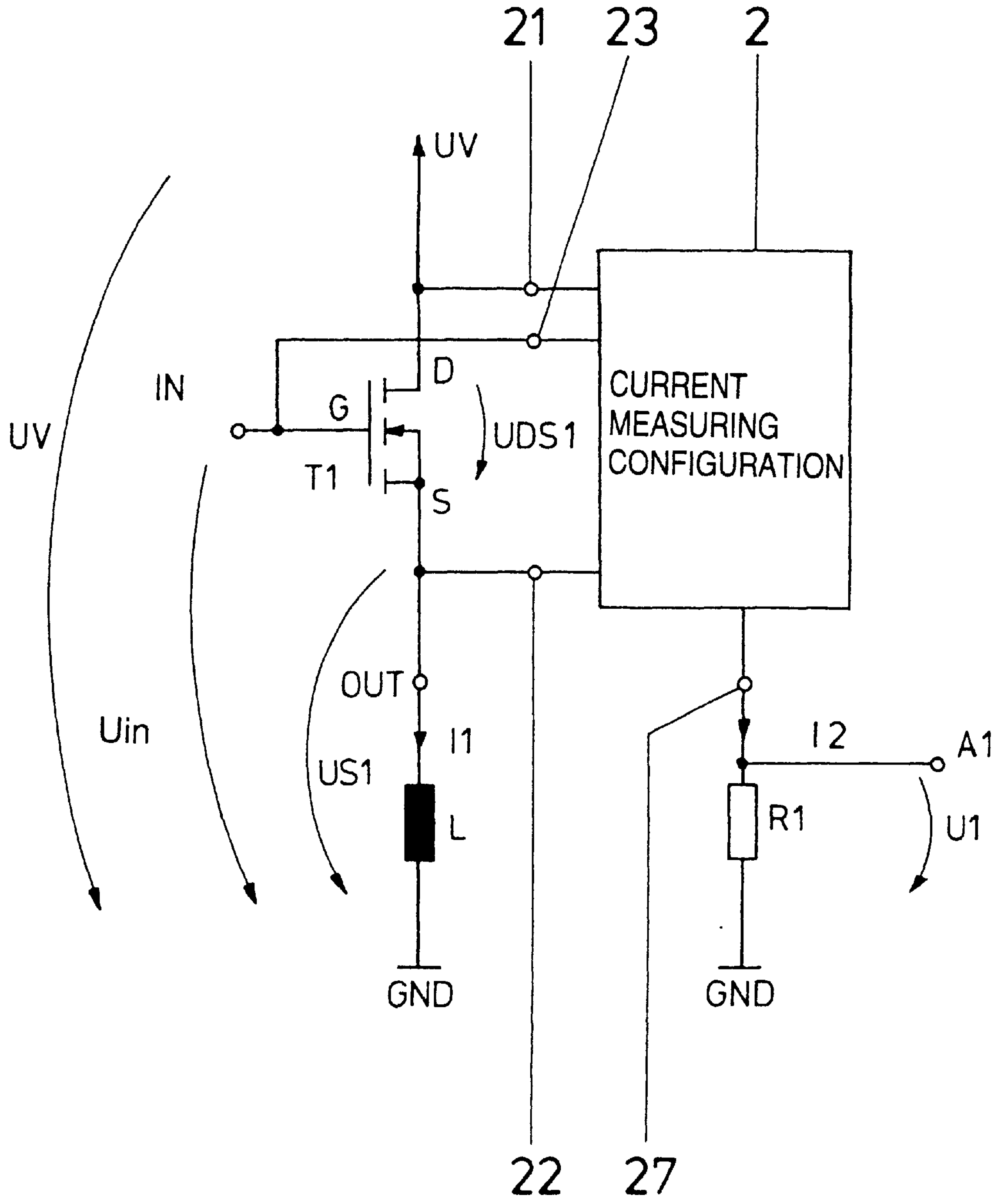
FIG. 2 is a circuit diagram of a circuit configuration according to the invention with a load transistor and a current measuring configuration.

FIG. 2 shows an exemplary embodiment of a circuit configuration according to the invention which has a load transistor T1 which is embodied in the example as an n-type channel MOS transistor and a current measuring configuration 2 which is connected to the load transistor T1. The gate terminal G of the load transistor T1 is connected to an input terminal IN of the circuit configuration, and the drain terminal D is connected to a terminal for a first supply potential UV. The source terminal S of the load transistor forms an output terminal OUT of the circuit configuration which serves for connecting to a terminal of a load L which is connected by another terminal to a second supply potential or a reference potential GND. In the exemplary embodiment, an inductor L is illustrated as a load by way of example in order to explain the method of operation of the circuit configuration. The reference potential GND is preferably ground.

The load transistor conducts reliably if its gate potential or the input voltage Uin applied to the input terminal IN with respect to the reference potential GND is greater than the first supply potential UV or the resulting supply voltage UV with respect to reference potential GND. Usual values for the input voltage Uin for driving the load transistor are approximately 8–9 V above the supply voltage UV. If the drain potential of the load transistor T1 which corresponds to the first supply potential UV is greater than its source potential US1, its drain-source voltage UDS1 is therefore positive and the transistor T1 is therefore in the normal operating mode. The load current I1 which is shown in FIG. 2 and which flows in the load transistor T1 of the circuit configuration if a load L is connected between the output terminal OUT and a terminals for reference potential GND, and which corresponds to the drain current of the load transistor T10 is then positive.

If the source potential US1 is greater than the drain potential UV, the load transistor T1 is in the inverse operating mode, and the load current I1 is then negative. A source potential US1 which is greater than the drain potential or the first supply potential UV can occur, in particular, when inductive loads are driven, for example when motor bridges are driven.

The current measuring configuration 2 has a first connecting terminal 21 which is connected to the drain terminal of the load transistor T1, a second connecting terminal 22 which is connected to the source terminal S of the load transistor T1 and a third connecting terminal 23 which is connected to the gate connecting terminal G of the load transistor. The measuring current I2 with respect to the reference potential GND is available at an output terminal 27 of the current measuring configuration, the output terminal 27 in the exemplary embodiment being connected to the reference potential via a current measuring resistor R1. According to the invention, this measuring current I2 has a sign which is reversed with respect to the load current I1, and the absolute value of the measuring current I2 is at least approximately proportional to the load current, that is to say the following applies:

$$I2 \propto -I1 \qquad \text{Equation (1)}$$

The circuit configuration according to the invention provides the advantage that in the inverse operating mode of the load transistor T1, when its load current I1 is negative, a measuring current I2 which is positive with respect to the reference potential GND is available, the measuring current I2 being converted through the use of the current measuring resistor R1 into a measuring voltage U1 which is positive with respect to the reference potential GND, at an output terminal A1. The supply potential UV which is applied to the connecting terminal 21, the drive voltage Uin which is applied to the connecting terminal 23 and the reference potential GND are necessary in the circuit configuration in order to provide the measuring current I20.

Figure 3:
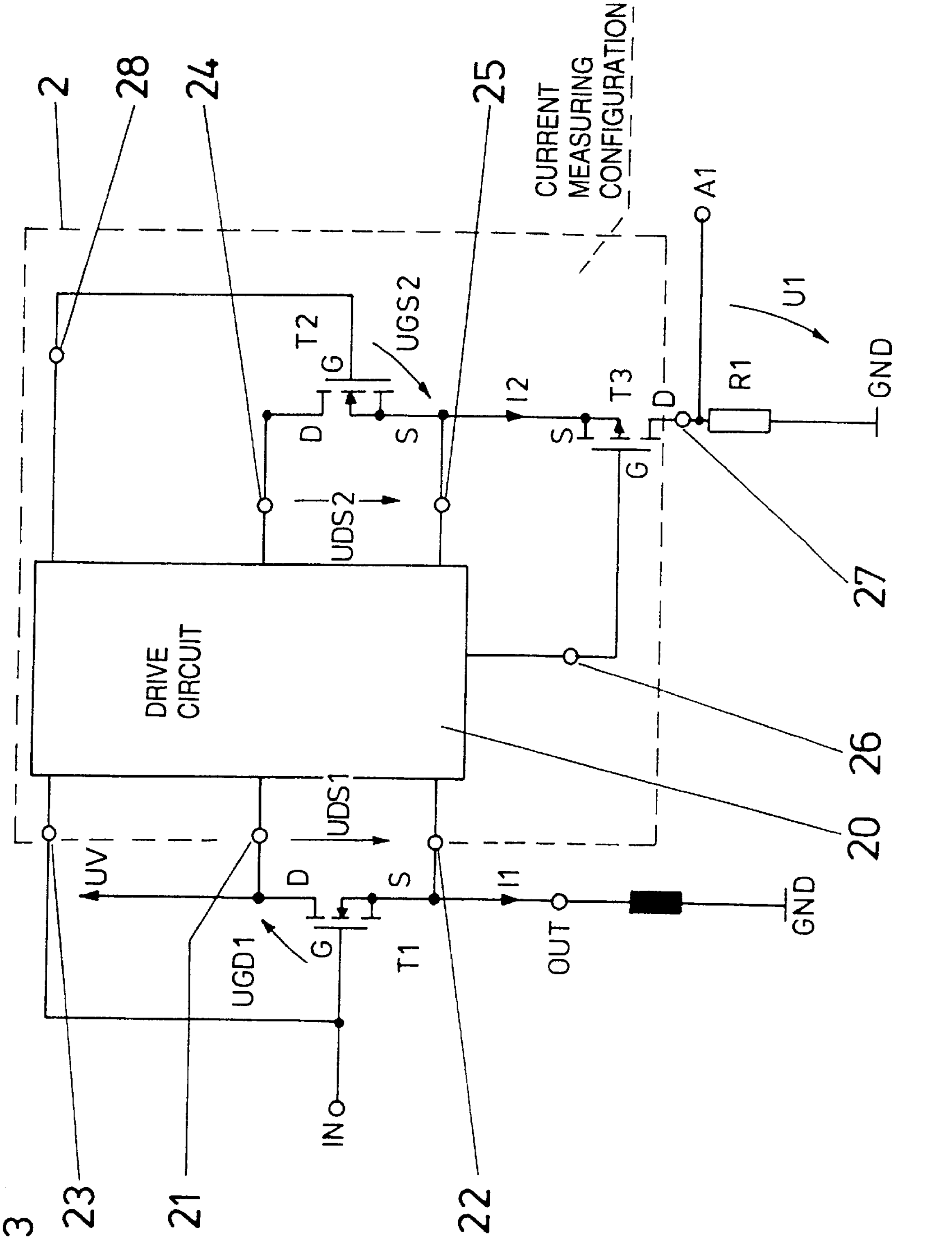
FIG. 3 is a circuit diagram of a circuit configuration according to the invention with a current measuring configuration which has a measuring transistor and a first control circuit.

FIG. 3 shows a circuit configuration according to the invention with a current measuring configuration 2, which has a measuring transistor T2 which is of the same conduction type as the load transistor Ti and is embodied in the exemplary embodiment as an n-type channel MOS transistor. The drain-source path D-S of the measuring transistor T2 has connected downstream of it a control transistor T3 which fulfills the function of a controllable resistor and which is embodied in the exemplary embodiment as a p-type channel MOS transistor. The source terminal S of the control transistor T3 is connected to the source terminal S of the measuring transistor T2, and the drain terminal D of the control transistor T3 is connected to the output terminal 27 of the current measuring configuration 2, and to the terminal for reference potential GND via the measuring resistor R1. In order to drive the control transistor T3 there is a drive circuit 20 which is connected, on the one hand, to the drain terminal D via the connecting terminals 21, and to the source terminal S of the load transistor T1 via the connecting terminal 22, and which, on the other hand, is connected via a connecting terminal 24 to the drain terminal D of the measuring transistor T2, and via a connecting terminal 25 to the source terminal S of the measuring transistor T2.

The gate terminal G of the load transistor T1 is also to connected to the drive circuit 20 via the terminal 23, and the gate terminal G of the measuring transistor T2 is connected to a terminal 28 of the drive circuit 20.

The control transistor T3, whose gate terminal is connected to an output 26 of the drive circuit, is driven according to one embodiment in such a way that the absolute value of the drain-source voltage UDS2 of the measuring transistor T2 which is applied between the connecting terminals 24, 25 corresponds to the absolute value of the drain-source voltage UDS1 of the load transistor which is applied between the connecting terminals 21, 22, the voltages having different signs, that is to say the following applies:

$$UDS2 = -UDS1 \qquad \text{Equation (2)}$$

The drive circuit preferably ensures that the gate-drain voltage UGD1 of the load transistor T1, that is to say the voltage applied between the terminals 23 and 21 of the drive circuit 20 corresponds to the gate-source voltage UGS2 of the measuring transistor T2, that is to say to the voltage applied between the terminals 28 and 25 of the drive circuit 20. The measuring transistor T2 is then operated at a operating point which is inverted with respect to the operating point of the load transistor T1. The conduction behavior of the load transistor T1 which is operated in the inverse operating mode is determined by its gate-drain voltage UGD1 and its drain-source voltage UDS1. The conduction behavior of the measuring transistor T2 is determined by its gate-source voltage UGS2 and its drain-source voltage UDS2. The absolute value of the gate-drain voltage UGD1 of the load transistor T1 corresponds to the absolute value of the gate-source voltage UGS2 of the measuring transistor T2, and the absolute values of the drain-source voltages UDS1, UDS2 of the load transistor T1 and of the measuring transistor T2 also correspond. The absolute value of the measuring current I2 is then proportional to the absolute value of the load current I1, the proportionality factor being determined by the ratio of the active transistor areas of the two transistors T1, T2. The load current I1 and the measuring current differ in their signs. If the load current I1 is negative with respect to the reference potential GND in the inverse operating mode of the load transistor T1, the measuring current is positive with respect to the reference potential GND.

This presumes that the two transistors T1, T2 are of symmetrical configuration, therefore that drain D and source S can be interchanged as desired. Given a non-symmetrical configuration, the load transistor T1 which is driven as a function of its gate-drain voltage UGD1 in the inverse operating mode has a smaller gain than the measuring transistor T2 which is driven as a function of its gate-source voltage UGS2. The absolute value of the measuring current I2 is then not exactly proportional to the load current I1. A resulting measuring error is, however, tolerable for customary applications of the measuring configuration.

Figure 4:
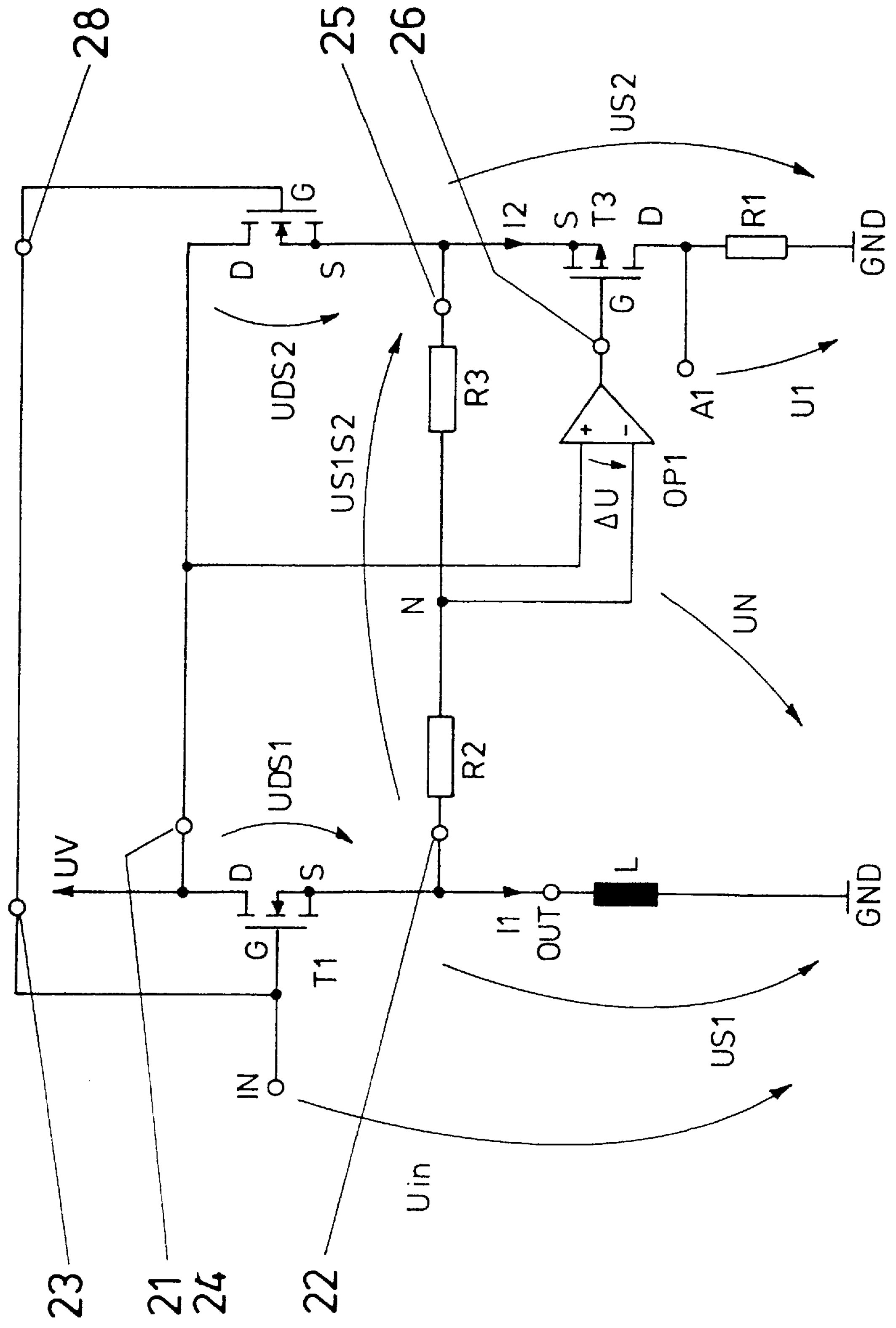
FIG. 4 is a circuit diagram of a circuit configuration according to the invention with a control circuit according to a first embodiment of the invention.

FIG. 4 shows a circuit configuration according to the invention with a drive circuit 20 which is illustrated in detail and which has a series circuit composed of first and second resistors R2, R3 which, according to one embodiment, have the same resistance value R, between the terminal 22 and the terminal 25, or the source terminal S of the load transistor T1 and the source terminal S of the measuring transistor T2. The drain terminal D of the load transistor T1 is connected directly to the drain terminal D of the measuring transistor T2 via the drive circuit 20. The drive circuit also has a control amplifier which is embodied as an operational amplifier OP1, a negative input of the operational amplifier OP1 being connected to a node which is common to the first and second resistors R2, R3, and a positive input of the operational amplifier OP1 being connected to the drain terminals D of the load transistor T1 and of the measuring transistor T2.

For the two drain-source voltages UDS1, UDS2 of the load transistor T1 and of the measuring transistor T2, UDS2=−UDS1 if the load transistor T1 is operated in the inverse operating mode as explained below.

The operational amplifier adjusts the resistance of the control transistor T3 in such a way that the voltage difference ΔU between its inputs is zero. A potential at the node N or a voltage at this node N with respect to reference potential then corresponds to the supply voltage and the following applies:

$$UV = UN \qquad \text{Equation (3)}$$

The source potential US1 of the load transistor T1, which is greater than the supply potential UV in the inverse operating mode, is composed of the voltage US1S2 between the source terminals S of the load transistor T1 and of the measuring transistor T2 on the one hand and the source potential US2 of the measuring transistor on the other, $$US1=US1S2+US2 \quad \text{Equation (4)}$$

in each case the voltage US1S2/2 being applied via the second and third resistors R2, R3. In other words, the following applies:

$$US1=US1S2/2+UN=US1S2/2+UV \quad \text{Equation (5)}$$

From Equations (4) and (5) it follows that:

$$US2=-US1+2UV \quad \text{Equation (6)}$$

The following applies for the drain-source voltage UDS1 of the load transistor T1:

$$UDS1=UV-US1 \quad \text{Equation (7)}$$

and the following applies for the drain-source voltage UDS2 of the measuring transistor T2:

$$UDS2=UV-US2 \quad \text{Equation (8)}$$

Inserting Equation (6) into Equation (8) yields the following:

$$UDS2=UV+US1-2UV=-UV+US1=-UDS1 \quad \text{Equation (9)}$$

The absolute value of the drain-source voltage UDS2 of the measuring transistor T2 therefore corresponds to the absolute value of the drain-source voltage UDS1 of the load transistor T1, the two voltages UDS1, UDS2 differing in their signs.

In the exemplary embodiment according to FIG. 4, the gate terminal G of the load transistor T1 is connected directly to the gate terminal G of the measuring transistor T2. In this context, the following applies for the gate-source voltage UGS2 of the measuring transistor T2, as a function of the gate-drain voltage UGD1 of the load transistor T1:

$$UGS2=UGD1+UDS2 \quad \text{Equation (10)}$$

The absolute values of the gate-drain voltage UGD1 and of the gate-source voltage UGS2 thus differ by the value of the drain-source voltage UGS2 of the measuring transistor, which corresponds in terms of absolute value to the drain-source voltage UDS1 of the load transistor T1. If one considers that in customary applications when the input voltage Uin is approximately 8 V above the supply voltage UV, the gate-drain voltage UGD1 is 8 V and the drain-source voltage is 50 mV, the gate-source voltage UGS2 of the measuring transistor T2 differs from the gate-drain voltage UGD1 of the load transistor by only approximately 0.6%. A resulting deviation of the operating point of the measuring transistor T2 from the operating point of the load transistor T1 leads to an error in the provision of the measuring current I2 which is however tolerable for a large number of applications.

The resistances R2, R3 between the source terminals S of the load transistor T1 and of the measuring transistor T2 are preferably very large in order to prevent a current flowing between the source terminal of the load transistor T1 and the source terminal S of the measuring transistor T2 significantly falsifying the measuring current I2.

Figure 5:
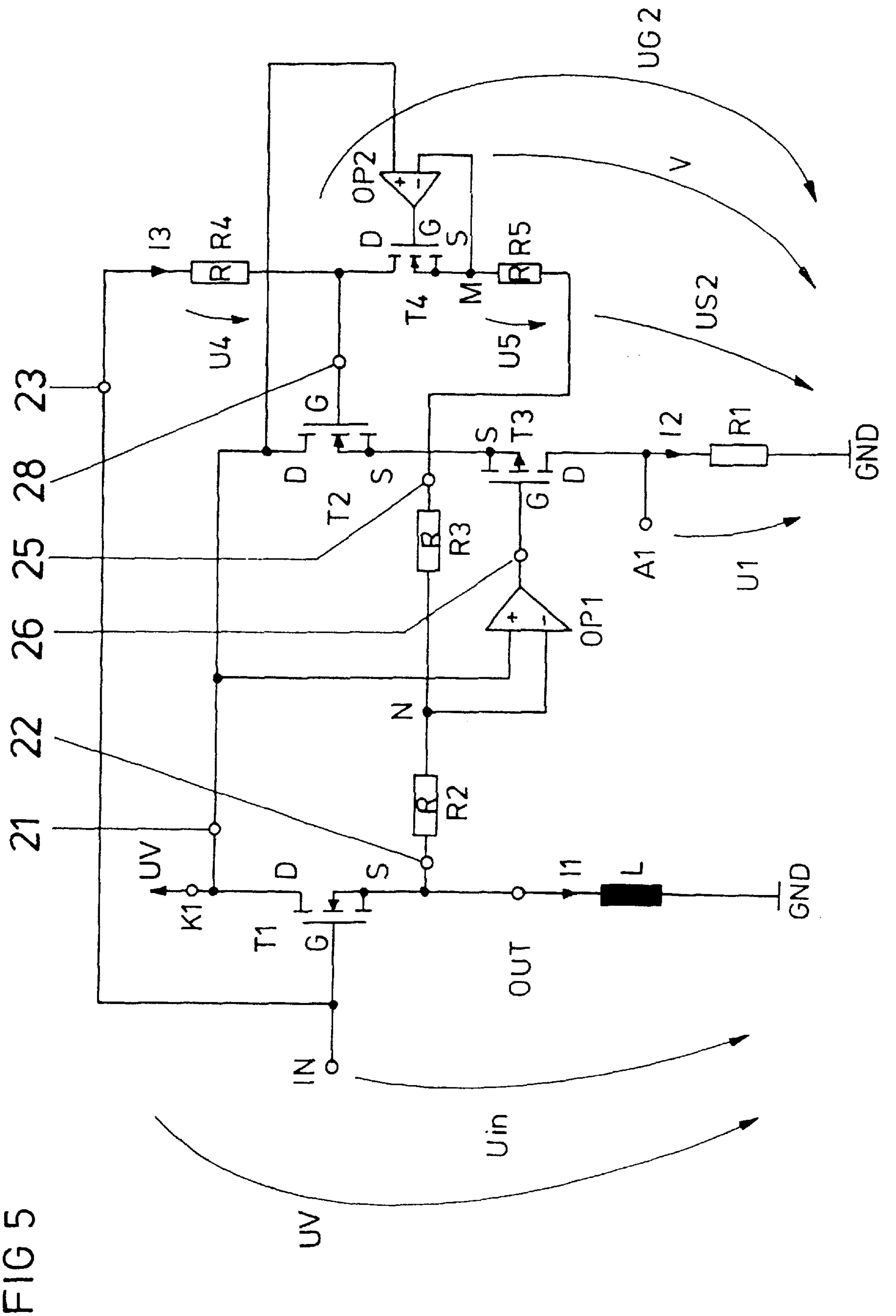
FIG. 5 is a circuit diagram of a circuit configuration according to the invention with a control circuit according to a second embodiment of the invention.

FIG. 5 shows an exemplary embodiment of a drive circuit according to the invention in which there is no deviation between the gate-drain voltage UGD1 of the load transistor T1 and the gate-source voltage UGS2 of the measuring transistor T2. In addition to the control circuit with the control transistor T3, the resistors R2, R3 and the operational amplifier, this drive circuit has a second control circuit with third and fourth resistors R4, R5, a further control transistor T4 and a further control amplifier OP2. In this exemplary embodiment, the gate terminal G of the measuring transistor T2 is connected to the gate terminal G of the load transistor T1 via the third resistor R4 and the terminal 23. A series circuit comprising the second control transistor T4 and the fourth resistor R5 is connected between the gate terminal G of the measuring transistor T2 and its source terminal S. The second control transistor T4 is driven by the control amplifier OP2 which is embodied as an operational amplifier, a positive terminal of the operational amplifier being connected to the drain terminal D of the load transistor T via the terminal 21, and a negative input of the operational amplifier OP2 being connected to a node M which is common to the fourth resistor R5 and the control transistor T4.

The resistors R4 and R5 have the same resistance value so that the voltages U4, US brought about by a current I3 across these resistors are of equal magnitude, that is to say:

$$U4=U5 \quad \text{Equation (11)}$$

The voltage U4 can be represented as follows:

$$U4=Uin-UG2 \quad \text{Equation (12)}$$

UG2 being the potential at the gate terminal G of the measuring transistor T2 with respect to reference potential GND. For the voltage US the following applies:

$$U5=UM-US2=UV-US2 \quad \text{Equation (13)}$$

From Equations (12) and (13) it follows that:

$$Uin-UV=UG2-US2 \quad \text{Equation (14)}$$

where $$Uin-UV=UGD1 \quad \text{Equation (15)}$$

and $$UG2-US2=UGS2 \quad \text{Equation (16)}$$

The gate-drain voltage UGD1 of the load transistor T1 thus corresponds to the gate-source voltage UGS2 of the measuring transistor T2.

The resistors R4, R5 are preferably very large in order to prevent the current flowing across the resistors R4, R5 from significantly falsifying the measuring current I2.

The measuring transistor T2 corresponds in configuration and in its properties to the load transistor T1, the active transistor area of the measuring transistor T2 being smaller than that of the load transistor T1. If the two transistors T1, T2 are operated at the same operating point, that is to say with the same gate-source voltages or the same gate-drain voltages and the same drain-source voltages, the currents flowing through the two transistors T1, T2 are proportional to one another, the proportionality factor corresponding to the ratio of the transistor areas. Given a non-symmetrical configuration of the two transistors T1, T2 their gain is smaller if they are operated in the inverse operating mode, that is to say with a negative drain-source voltage. This leads to a situation in which the gain of the load transistor T1, which according to the invention is in the inverse operating mode, is smaller than the gain of the measuring transistor T2 which is in the normal operating mode. The gain of the load transistor T1 is dependent on its gate-drain voltage UGD1 and its gate-source voltage UGS2 in the inverse operating mode, and the gain of the measuring transistor T2 is dependent on its gate-source voltage UGS2 and on its drain-source voltage UDS2 in the normal operating mode. The different gain values of the load transistor T1 in the inverse operating mode and of the measuring transistor T2 in the normal operating mode lead to a situation in which, given drain-source voltages UDS1, UDS2 which are identical in terms of absolute value and given a gate-source voltage UGS2 of the measuring transistor T2 which corresponds in absolute value to the gate-drain voltage UGD1 of the load transistor T1, the measuring current I2 is somewhat too large.

In order to compensate for the different gain values of the load transistor T1 and of the measuring transistor T2, according to a further embodiment of the invention there is therefore provision that the drive circuit 20 sets the gate-source voltage UGS2 of the measuring transistor T2 to be smaller than the gate-drain voltage UGD1 of the load transistor T1. With the control circuit having the resistors R4, R5, the transistor T4 and the control amplifier OP2, this can be achieved by making a selection in which the resistance RS is smaller than the resistance R4.

In a further embodiment there is provision for the drive circuit 20 and the control transistor T3 to set the absolute value of the drain-source voltage UDS2 of the measuring transistor T2 to be smaller than the absolute value of the drain-source voltage UDS1 of the load transistor T1. In the control circuit with the first and second resistors R2, R3 this can be achieved by making a selection in which the first resistance R2 is greater than the second resistance R3.

The load in the exemplary embodiments is illustrated by way of example as an inductor. With the circuit configuration according to the invention it is, of course, also possible to drive any other desired loads, for example motors, solenoid valves, ohmic loads and the like.

The circuit configuration with the load transistor T1, the current measuring configuration and, if appropriate, the measuring resistor R1 is preferably integrated in a semiconductor element.

I claim:

1. A circuit configuration, comprising:

a load transistor having a control terminal, a first load path terminal to be connected to a first supply potential, and a second load path terminal to be connected a load, said load transistor having a load current flowing between said first load path terminal and said second load path terminal; and a current measuring configuration connected to said load transistor, said current measuring configuration having an output for providing a measuring current between said output of said current measuring configuration and a second supply potential, said current measuring configuration providing the measuring current such that the measuring current and the load current have respectively opposite signs and such that the measuring current and the load current have respective absolute values at least substantially proportional to one another.

2. The circuit configuration according to claim 1, wherein said current measuring configuration has a first connecting terminal connected to said first load path terminal of said load transistor, a second connecting terminal connected to said second load path terminal of said load transistor, and a third connecting terminal connected to said control terminal of said load transistor.

3. The circuit configuration according to claim 2, wherein said current measuring configuration includes:

a measuring transistor having a control terminal, a first load path terminal and a second load path terminal;

a controllable resistor having a control terminal and a load path, said load path being connected to said second load path terminal of said measuring transistor; and a drive circuit having an output terminal connected to said control terminal of said controllable resistor, said drive circuit being connected to said control terminal of said load transistor, to said first load path terminal of said load transistor, to said second load path terminal of said load transistor, to said control terminal of said measuring transistor, to said first load path terminal of said measuring transistor and to said second load path terminal of said measuring transistor.

4. The circuit configuration according to claim 3, wherein said drive circuit drives said controllable resistor in dependence of a first load path voltage between said first and second load path terminals of said load transistor, and in dependence of a second load path voltage between said first and second load path terminals of said measuring transistor.

5. The circuit configuration according to claim 4, wherein said drive circuit drives said controllable resistor such that the second load path voltage and the first load path voltage have substantially identical absolute values and such that the second load path voltage and the first load path voltage have respectively opposite signs.

6. The circuit configuration according to claim 4, wherein said drive circuit drives said controllable resistor such that an absolute value of the second load path voltage is smaller than an absolute value of the first load path voltage, and such that the second load path voltage and the first load path voltage have respectively opposite signs.

7. The circuit configuration according to claim 4, wherein said drive circuit includes:

a series circuit including a first resistor, a second resistor and a tap node; and a control amplifier having a first input, a second input, and an output, said tap node of said series circuit being connected to said first input of said control amplifier, said first load path terminals of said load transistor and of said measuring transistor being connected to said second input of said control amplifier, and said control terminal of said controllable resistor being connected to said output of said control amplifier.

8. The circuit configuration according to claim 7, wherein said first resistor and said second resistors have substantially identical resistance values.

9. The circuit configuration according to claim 7, wherein said first resistor has a first resistance, said second resistor has a second resistance, and said first resistance is greater than said second resistance.

10. The circuit configuration according to claim 9, including a control configuration having:

a third resistor connected between said control terminal of said load transistor and said control terminal of said measuring transistor;

a series circuit including a fourth resistor and a controllable resistor, said series circuit being connected between said control terminal of said measuring transistor and said second load path terminal of said measuring transistor, said fourth resistor and said controllable resistor having a common node; and a control amplifier having a first input connected to said first load path terminal of said load transistor and to said first load path terminal of said measuring transistor, a second input connected to said common node, and an output connected to said control terminal of said controllable resistor.

11. The circuit configuration according to claim 10, wherein said third resistor and said fourth resistor have substantially identical resistance values.

12. The circuit configuration according to claim 10, wherein said third resistor has a third resistance, said fourth resistor has a fourth resistance, and said fourth resistance is smaller than said third resistance.

13. The circuit configuration according to claim 10, wherein said controllable resistor is a transistor.

14. The circuit configuration according to claim 3, wherein said controllable resistor is a transistor.

15. The circuit configuration according to claim 3, wherein said control terminal of said load transistor is connected to said control terminal of said measuring transistor.

16. The circuit configuration according to claim 3, including a control configuration connected between said control terminal of said load transistor and said control terminal of said measuring transistor.

17. The circuit configuration according to claim 16, wherein said control configuration sets a first voltage between said control terminal of said measuring transistor and said second load path terminal of said measuring transistor such that the first voltage has an absolute value substantially identical to an absolute value of a second voltage present between said control terminal of said load transistor and said first load path terminal of said load transistor.

18. The circuit configuration according to claim 16, wherein said control configuration sets a first voltage between said control terminal of said measuring transistor and said second load path terminal of said measuring transistor such that an absolute value of the first voltage is smaller than an absolute value of a second voltage present between said control terminal of said load transistor and said first load path terminal of said load transistor.

19. The circuit configuration according to claim 16, wherein said control configuration includes:

a first resistor connected between said control terminal of said load transistor and said control terminal of said measuring transistor;

a series circuit including a second resistor and a controllable resistor, said series circuit being connected between said control terminal of said measuring transistor and said second load path terminal of said measuring transistor, said second resistor and said controllable resistor having a common node; and a control amplifier having a first input connected to said first load path terminal of said load transistor and to said first load path terminal of said measuring transistor, a second input connected to said common node, and an output connected to said control terminal of said controllable resistor.

20. The circuit configuration according to claim 19, wherein said first resistor and said second resistor have substantially identical resistance values.

21. The circuit configuration according to claim 19, wherein said first resistor has a first resistance, said second resistor has a second resistance, and said second resistance is smaller than said first resistance.

22. The circuit configuration according to claim 19, wherein said controllable resistor is a transistor.

* * * * *